(12) United States Patent
Kajiyama et al.

(10) Patent No.: US 9,726,709 B2
(45) Date of Patent: Aug. 8, 2017

(54) SEMICONDUCTOR CHIP AND METHOD FOR DETECTING DISCONNECTION OF WIRE BONDED TO SEMICONDUCTOR CHIP

(71) Applicant: Toyota Jidosha Kabushiki Kaisha, Toyota-shi, Aichi-ken (JP)

(72) Inventors: Taro Kajiyama, Toyota (JP); Kazushi Yamanaka, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 50 days.

(21) Appl. No.: 15/016,596

(22) Filed: Feb. 5, 2016

(65) Prior Publication Data

US 2016/0231373 A1 Aug. 11, 2016

(30) Foreign Application Priority Data

Feb. 6, 2015 (JP) .................................. 2015-022068

(51) Int. Cl.
G01R 31/04 (2006.01)
G01R 31/26 (2014.01)
G01R 1/04 (2006.01)
G01R 31/28 (2006.01)

(52) U.S. Cl.
CPC ........... *G01R 31/26* (2013.01); *G01R 1/0408* (2013.01); *G01R 31/04* (2013.01); *G01R 31/046* (2013.01); *G01R 31/2808* (2013.01); *G01R 31/2818* (2013.01); *G01R 31/2853* (2013.01); *G01R 31/2856* (2013.01); *H01L 2224/05554* (2013.01); *H01L 2224/49113* (2013.01)

(58) Field of Classification Search
CPC .. G01R 1/0408; G01R 31/04; G01R 31/2808; G01R 31/2818; G01R 31/002; G01R 31/00
USPC ... 324/66, 71, 378, 403, 415, 425, 500, 537, 324/538
See application file for complete search history.

(56) References Cited

U.S. PATENT DOCUMENTS

| 2009/0166774 A1* | 7/2009 | Takahira | H01L 24/45 257/431 |
| 2013/0037928 A1* | 2/2013 | Sasaki | H01F 27/2804 257/691 |
| 2015/0109504 A1* | 4/2015 | Sakuragi | H01L 27/14634 348/302 |

FOREIGN PATENT DOCUMENTS

JP 2013-225535 A 10/2013

\* cited by examiner

*Primary Examiner* — Jermele M Hollington
*Assistant Examiner* — Raul Rios Russo
(74) *Attorney, Agent, or Firm* — Dinsmore & Shohl LLP

(57) ABSTRACT

A semiconductor chip is provided with first and second electrode pads, a first current detector, and a third electrode pad. The first and second electrode pads are both to be wire-bonded to a first lead terminal. The first current detector is connected between the first and second electrode pads. The third electrode pad is wire-bonded to a second lead terminal. A first closed circuit is configured by the first lead terminal, the first electrode pad, the first current detector, and the second electrode pad. An induced current flows through the first closed circuit when a current generating an induced electromotive force is applied to the third electrode pad. The first current detector is configured to output different values depending on whether the induced current exceeds a threshold value or not.

8 Claims, 3 Drawing Sheets

SEMICONDUCTOR CHIP AND METHOD FOR DETECTING DISCONNECTION OF WIRE BONDED TO SEMICONDUCTOR CHIP

CROSS-REFERENCE TO RELATED APPLICATION

This application claims priority to Japanese Patent Application No. 2015-022068 filed on Feb. 6, 2015, the contents of which are hereby incorporated by reference into the present application.

TECHNICAL FIELD

The present application relates to a semiconductor chip and a method for detecting disconnection of a wire bonded to the semiconductor chip.

DESCRIPTION OF RELATED ART

An electrode pad provided on a semiconductor chip is wire-bonded to a lead terminal via a wire. The lead terminal serves to provide a power-supply voltage via the wire to a circuit in the semiconductor chip, to input and output a signal to and from the circuit, or to receive an output voltage of the circuit in the semiconductor chip.

In some cases, a plurality of electrode pads is provided on a semiconductor chip, and each electrode pad is wire-bonded to one common lead terminal (so-called multi bonding). This enables to apply a power-supply voltage from said lead terminal to the plurality of electrode pads, which enables to apply a larger current to a circuit in the semiconductor chip (in the following, an electrode pad to which the power-supply voltage is applied will be referred to as a power electrode pad).

Japanese Patent Application Publication No. 2013-225535 discloses a semiconductor chip which detects disconnection among multi-bonded wires. The semiconductor chip is provided with a plurality of power electrode pads, and an input signal electrode pad configured to input a signal to a circuit in the chip. The input signal electrode pad is arranged adjacent to the power electrode pads. Each of the plurality of the power electrode pads is multi-bonded to one common power lead terminal. The input signal electrode pad is wire-bonded to an input signal lead terminal different from the power lead terminal. A circuit is connected between each of the plurality of the power electrode pads and the input signal electrode pad, and a resistor with different resistance from each other is connected to each of the circuits. This enables to detect which wire is disconnected among the multi-bonded wires by applying a power-supply voltage to the power lead terminal and measuring a current output from the input signal lead terminal.

BRIEF SUMMARY

In the technology disclosed in Japanese Patent Application Publication No. 2013-225535, when detecting disconnection among the multi-bonded wires, a tester for applying a voltage (a voltage applying module) is connected to the power lead terminal, and a tester for measuring a current (a current measurement module) is connected to the input signal lead terminal. As described above, the technology disclosed in Japanese Patent Application Publication No. 2013-225535 requires the testers to be allocated respectively to the power lead terminal and to the input signal lead terminal in order to detect disconnection among the wires.

The present description provides a technology enabling to reduce a use of a tester when detecting disconnection among wires which are wire-bonded to a common lead terminal.

The present description discloses a semiconductor chip comprising a first electrode pad, a second electrode pad, a first current detector, and a third electrode pad. The first electrode pad is to be wire-bonded to a first lead terminal. The second electrode pad is to be wire-bonded to the first lead terminal to which the first electrode pad is to be wire-bonded. The first current detector is connected between the first electrode pad and the second electrode pad. The third electrode pad is to be wire-bonded to a second lead terminal different from the first lead terminal. A first closed circuit is configured by the first lead terminal, the first electrode pad, the first current detector, and the second electrode pad. An induced current flows through the first closed circuit when a current generating an induced electromotive force is applied to the third electrode pad. The first current detector is configured to output different values depending on whether the induced current exceeds a threshold value or not.

In the above semiconductor chip, when the first electrode pad and the second electrode pad are wire-bonded to the first lead terminal, the first closed circuit is formed by the first lead terminal, the first electrode pad, the first current detector, and the second electrode pad. Here, in a case where wires forming the first closed circuit are not disconnected, an induced electromotive force is generated in the first closed circuit by electromagnetic induction when magnetic flux penetrating the first closed circuit changes by an application of the current generating the induced electromotive force to the third electrode pad, resulting in an induced current flowing through the first closed circuit. On the other hand, in a case where at least one of the wires forming the first closed circuit is disconnected, even when the magnetic flux penetrating the first closed circuit changes by the application of the current generating the induced electromotive force to the third electrode pad, electromagnetic induction does not occur, as a result of which the induced current does not flow through the first closed circuit. The first current detector is configured to output different values depending on whether the induced current exceeds the threshold value or not. By making the threshold value of the first current detector less than a value of the induced current flowing through the first closed circuit when none of the wires forming the first closed circuit are disconnected, a disconnection among the wires can be detected depending on the output from the first current detector. As described above, the above semiconductor chip has a configuration in which a wire disconnection is detectable based on the induced current flowing through the first closed circuit. Therefore, it is not necessary to allocate testers to both of the first lead terminal and the second lead terminal in order to detect the wire disconnection, and thus the use of testers can be reduced. Moreover, since it becomes possible to detect the wire disconnection by making use of a current applying module of a tester, a number of functions required for the tester can be reduced. Note that when the current flowing through the first current detector is equal to the threshold value, the first current detector may indicate the output for the case where the current exceeds the threshold value, or may indicate the output for the case where the current falls below the threshold value. Besides, in the present description, for a purpose of simplifying explanation, a circuit comprising the first lead terminal, the first electrode pad, the first current detector, and the second electrode pad is referred to as "a first closed circuit" even when at least one of the wires is disconnected. In addition, in the following, "disconnection among wires forming a closed circuit" is simply referred to also as "wire disconnection".

Moreover, the present description discloses a novel method for detecting the wire disconnection in the semiconductor chip. In the above method, disconnection of at least one of wires, that comprises a wire with which the first electrode pad formed on the semiconductor chip and the first lead terminal are wire-bonded and a wire with which the second electrode pad formed on the semiconductor chip and the first lead terminal are wire-bonded is detected. In the above method, a current generating an induced electromotive force is applied to the third electrode pad from the second lead terminal to detect an output from the first current detector at the time when the current generating the induced electromotive force is applied. According to the above method, information necessary for determining whether at least one of the wires is disconnected or not can be obtained by applying the current to the second lead terminal. The only function required for the tester is a function of applying the current. The tester can be used in an effective manner. Moreover, the above method can be performed at the same time as another test that involves applying a current to the second lead terminal. In this case, it becomes unnecessary to apply the current to the second lead terminal only to detect the disconnection. Therefore, a tester used solely for detecting disconnection becomes unnecessary and thus a test time can be shortened.

Further, the present description discloses another novel method for detecting disconnection among wires of a semiconductor chip, which is different from the above method for detecting the disconnection. In this method, the disconnection of at least one of a first wire and a second wire of the semiconductor chip is detected. The semiconductor chip comprises a first electrode pad to be wire-bonded to a lead terminal with the first wire, a second electrode pad to be wire-bonded to the lead terminal with the second wire, and a current detector connected between the first electrode pad and the second electrode pad. Here, a closed circuit is configured by the lead terminal, the first wire, the first electrode pad, the current detector, the second electrode pad, and the second wire. The method comprises applying magnetic flux and detecting disconnection. In the applying of magnetic flux, magnetic flux is applied in a direction penetrating the closed circuit. In the detecting of disconnection, the disconnection of at least one of the first wire and the second wire is detected depending on an output value from the current detector in the applying of magnetic flux. In the above method, magnetic flux can be applied to the closed circuit using various configurations in the applying of magnetic flux, and therefore degree of freedom in designing the semiconductor chip improves.

BRIEF DESCRIPTION OF DRAWINGS

FIG. 1 shows a plan view of a semiconductor device of embodiment 1 and shows a case where a switch SW2 is on.

FIG. 2 shows a plan view of a semiconductor device of modification example 1 and shows a case where a switch SW2 is on.

FIG. 3 shows a plan view of a semiconductor device of embodiment 2 and shows a case where a switch SW2 is on.

DETAILED DESCRIPTION

Embodiment 1

Figure 1:
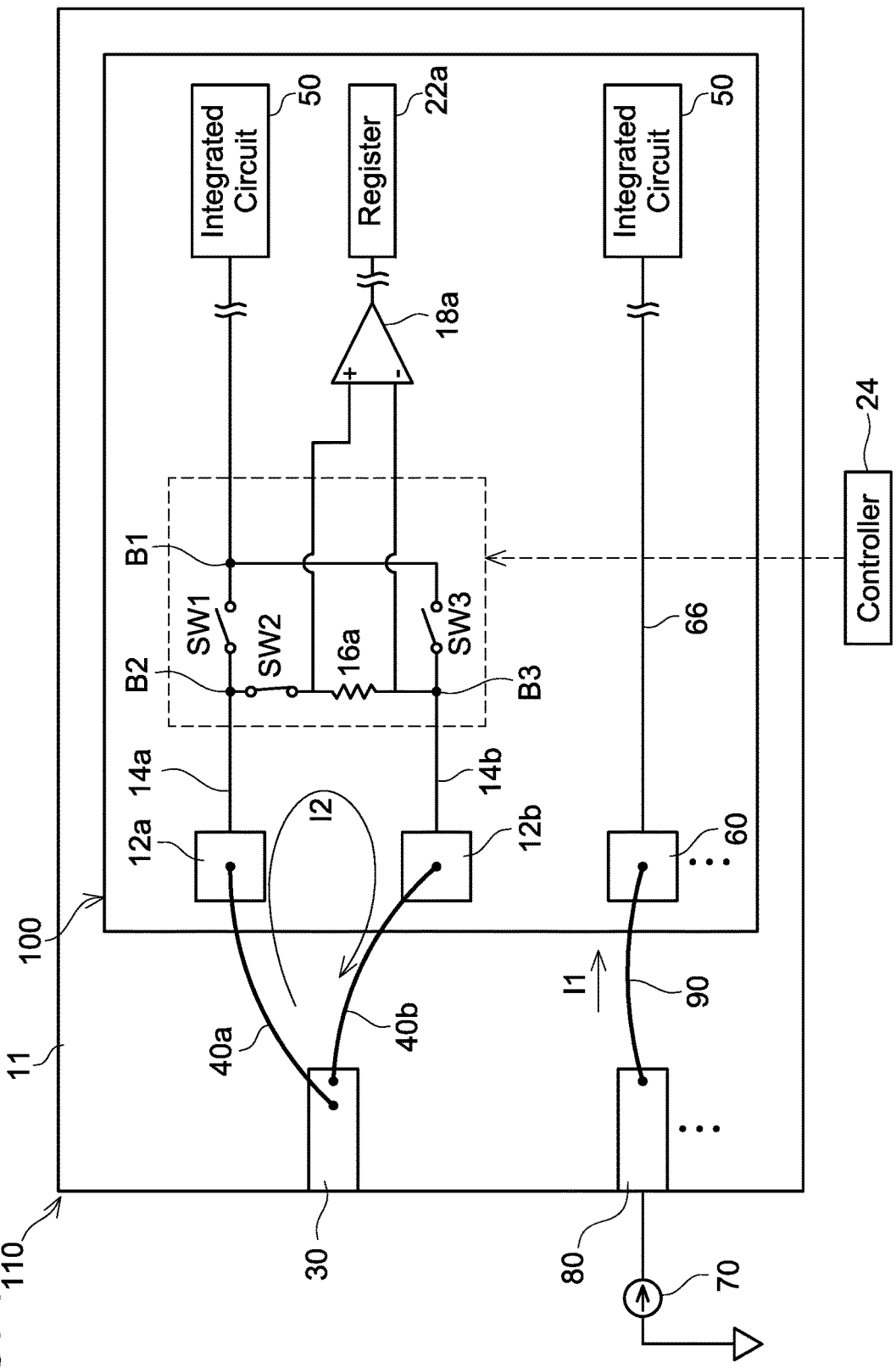

A semiconductor chip 100 of embodiment 1 will be explained with reference to FIG. 1. The semiconductor chip 100 is an electronic component with a rectangular parallelepiped shape provided with an integrated circuit 50. The semiconductor chip 100 is packaged by resin 11 together with a plurality of lead terminals, and thereby composes a semiconductor device 110. In FIG. 1, two lead terminals 30, 80 among the plurality of terminals are illustrated. Note that in FIG. 1, illustration of parts of the lead terminals 30, 80 protruding outside of the resin 11 is omitted. Besides, in FIG. 1, for a purpose of clarifying illustration, only outer shape of the resin 11 is illustrated, omitting illustration of the resin 11 covering the lead terminals 30, 80 and the semiconductor chip 100.

The semiconductor chip 100 comprises electrode pads 12a, 12b, 60, wires 14a, 14b, 66, a resistor 16a, a comparator 18a, a controller 24, and switches SW1, SW2, SW3. The electrode pads 12a, 12b, 60 are adjacently provided in this order on an outer circumferential part of an upper surface of the semiconductor chip 100 (that is, a surface opposite to a surface (a lower surface) in contact with a die pad (illustration omitted) of a lead frame (illustration omitted) when the semiconductor chip 100 is mounted on the die pad. The electrode pad 12a is wire-bonded to one end of the lead terminal 30 with a wire 40a. The electrode pad 12b is wire-bonded to the one end of the lead terminal 30 with a wire 40b. That is, electrode pads 12a, 12b are double-bonded to the common lead terminal 30. The electrode pad 60 is wire-bonded to one end of the lead terminal 80 with a wire 90. Note that although plural electrode pads are provided on the upper surface of the semiconductor chip 100, only electrode pads 12a, 12b, 60 are illustrated in FIG. 1. Electrode pads 12a, 12b, 60 correspond to one example of "first electrode pad", "second electrode pad", and "third electrode pad", respectively, and lead terminals 30, 80 correspond to one example of "first lead terminal" and "second lead terminal", respectively.

The wire 14a connects the electrode pad 12a with the integrated circuit 50. The wire 14b connects the electrode pad 12b with the integrated circuit 50. With this, when a power supply voltage is applied to the lead terminal 30, voltage is applied to each of the electrode pads 12a, 12b, and current is supplied to the integrated circuit 50 via the wires 14a, 14b. By the lead terminal 30 being double-bonded to two electrode pads 12a, 12b, a large current can be supplied to the integrated circuit 50. The wire 14a and the wire 14b join together at a point B1 to be one wire. In the present embodiment, a wire on the integrated circuit 50 side from the point B1 serves both as the wire 14a and as the wire 14b. The wire 66 connects the electrode pad 60 with the integrated circuit 50.

The resistor 16a is a resistor with resistance R1, and is connected between a point B2 of the wire 14a and a point B3 of the wire 14b. The comparator 18a is configured to compare a voltage on a higher potential side and a voltage on a lower potential side of the resistor 16a and to output a comparison result as a binary signal of H (high) or L (low). Specifically, one end of the resistor 16a (an upper side of the resistor 16a in FIG. 1) is connected to a non-inverting input terminal Vin+ of the comparator 18a, and another end (a lower side of the resistor 16a in FIG. 1) is connected to an inverting input terminal Vin−. An output terminal Vout of the comparator 18a is connected to a register 22a inside of the semiconductor chip 100. The comparator 18a is a comparator with a threshold value. A voltage Vin1 across both ends of the resistor 16a (hereinafter also called as "input voltage Vin1") is input to the non-inverting input terminal Vin+. In a case where the input voltage Vin1 exceeds the threshold value, the output terminal Vout outputs an H signal, while in a case where the input voltage Vin1 falls below the threshold value, the output terminal Vout outputs an L signal. An output signal is stored in the register 22a. The output signal stored in the register 22a can be read out. Note that the resistor 16a corresponds to one example of "first resistor", and the comparator 18a corresponds to one example of "first comparator".

The switch SW1 is provided between the point B1 and the point B2 of the wire 14a. The switch SW2 is provided, adjacent to the resistor 16a, between the point B2 and the point B3. The switch SW3 is provided between the point B1 and the point B3 of the wire 14b. The controller 24 controls on and off of the switches SW1 to SW3. Specifically, the controller 24 turns off the switches SW1, SW3 when turning on the switch SW2, and turns off the switch SW2 when turning on the switches SW1, SW3. While the switch SW2 is on, a closed circuit L1 is formed in which the lead terminal 30, the electrode pad 12a, the switch SW2, the resistor 16a, and the electrode pad 12b with wires 40a, 40b and wires 14a, 14b are connected. In this state, since the switches SW1, SW3 are off, the electrode pads 12a, 12b are electrically disconnected from the integrated circuit 50 and are in a non-conducting state. On the other hand, while the switch SW2 is off, the closed circuit L1 is not formed. In this state, since the switches SW1, SW3 are on, the electrode pads 12a, 12b are connected to the integrated circuit and are in a conducting state. Note that the closed circuit L1 corresponds to one example of "first closed circuit".

A current source 70 is connectable to another end of the lead terminal 80 (that is, a part of the lead terminal 80 protruding from the resin 11). The current source 70 is a current source for a test (tester), and is used to test product quality of the semiconductor device 110 (the semiconductor chip 100) by supplying a current I1 to the lead terminal 80.

A method for detecting disconnection of at least one of the wires 40a, 40b (that is, wires being double-bonded) will be explained The method for detecting disconnection is performed at a same time as an operation confirmation step. In the operation confirmation step, first, the controller 24 turns on the switch SW2 and turns off the switches SW1, SW3. Accordingly, the closed circuit L1 is formed, and the electrode pads 12a, 12b are electrically disconnected from the integrated circuit 50. Next, the current source 70 is connected to the lead terminal 80 to supply the current I1. Then, whether the semiconductor device 110 properly operates or not is tested. A test performed in the operation confirmation step may be any type of test as long as the current I1 is supplied to the lead terminal 80 from the current source 70 in the test. The current I1 supplied to the lead terminal 80 flows through the wire 90 rightward in FIG. 1. This generates a concentric magnetic field around the wire 90 in a clockwise direction seen along a traveling direction of the current. Since the closed circuit L1 is positioned on a left side of the wire 90 seen along the traveling direction of the current, the magnetic field generated penetrates the closed circuit L1 in a direction from the lower surface toward the upper surface of the semiconductor chip 100. Note that the current I1 corresponds to one example of "current generating an induced electromotive force".

In a case where none of the wires 40a, 40b are disconnected, the magnetic flux penetrating the closed circuit L1 changes when the magnetic field generated around the wire 90 penetrates the closed circuit L1, resulting in a generation of an induced electromotive force Ve1 in the closed circuit L1 by electromagnetic induction. The induced electromotive force Ve1 is equal to a rate of change of the magnetic flux with time. In other words, the induced electromotive force Ve1 is proportional to both a rate of change of the current I1 with time and an area of the closed circuit L1. In the present embodiment, the current source 70 supplies the current I1 that increases at a constant rate of change during a predetermined time in the operation confirmation step. Therefore, the induced electromotive force Ve1 comes to be at a constant value.

The resistance R1 of the resistor 16a of the closed circuit L1 is quite large compared to resistances of other elements constituting the closed circuit L1 (that is, wires 40a, 40b or wires 14a, 14b) such that a voltage drop in the closed circuit L1 can be regarded to occur only in the resistor 16a. In this case, the voltage drop in the resistor 16a (that is, a voltage across the both ends of the resistor 16a) is equal to the induced electromotive force Ve1 by Kirchhoff's second law. With this configuration, an induced current I2 (=Ve1/R1) flows through the closed circuit L1 in a clockwise direction (refer to an arrow in FIG. 1). Accordingly, the input voltage Vin1 equaling in its value to the induced electromotive force Ve1 is input to the non-inverting input terminal Vin+ of the comparator 18a (that is, Vin1=Ve1). The threshold value of the comparator 18a is preset so as to be larger than 0 and smaller than Ve1. Accordingly, the input voltage Vin1 (=Ve1) input to the non-inverting input terminal Vin+ of the comparator 18a exceeds the threshold value, resulting in the output terminal Vout outputting the H signal. The output signal is stored in the register 22a.

On the other hand, in a case where at least one of the wires 40a, 40b is disconnected, the electromagnetic induction does not occur in the closed circuit L1 even when the magnetic field generated around the wire 90 penetrates the closed circuit L1, and thus the input voltage Vin1 becomes 0 [V]. Accordingly, the input voltage Vin1 falls below the threshold value, which causes the output terminal Vout to output the L signal. The output signal is stored in the register 22a.

The presence of the disconnection can be detected by reading the output signal stored in the register 22a. When a read value is the H signal, it is determined that the wires 40a, 40b are not being disconnected, and when the read value is the L signal, it is determined that at least one of the wires 40a, 40b is disconnected. By adopting a configuration of outputting the presence of the disconnection among the wires 40a, 40b using the binary signal in the comparator 18a, the disconnection among the wires 40a, 40b can be easily detected by reading the output signal. Note that the test for detecting disconnection is performed in advance to the semiconductor device 110 being mounted on a substrate.

The semiconductor device 110 detected to have no disconnection in the disconnection detection test is subjected to further tests, and when the semiconductor device 110 is determined to be a non-defective product as a result, it is mounted on the substrate. In using the semiconductor device 110 in a normal operation after it has been mounted on the substrate, first, the controller 24 turns on the switches SW1, SW3 and turns off the switch SW2. Next, the power supply voltage is applied to the lead terminal 30 to apply a voltage to the electrode pads 12a, 12b. Accordingly, the current is supplied to the integrated circuit 50 via the wires 14a, 14b from the lead terminal 30. As above, the controller 24 switches the switches SW1 to SW3 in different ways for the case of detecting a disconnection in the wires 40a, 40b and for the case of using the semiconductor device 110 in the normal operation. Accordingly, when the disconnection of at least one of the wires 40*a*, 40*b* is detected, the induced current I2 flowing through the closed circuit L1 can be suppressed from flowing toward an integrated circuit 50 side. On the other hand, when the semiconductor device 110 is used in the normal operation, the current flowing through the integrated circuit 50 via the wires 14*a*, 14*b* from the lead terminal 30 can be suppressed from flowing into a resistor 16*a* side and a comparator 18*a* side. Therefore, the input voltage Vin1, which is based on a calculated value (that is, the induced electromotive force Ve1), is input to the non-inverting input terminal Vin+ of the comparator 18*a*, as a result of which a precise output signal is output from the output terminal Vout. Accordingly, reliability of the disconnection detection in the wires 40*a*, 40*b* is improved.

In the above semiconductor device 110, when neither of the wires 40*a*, 40*b* are disconnected, a voltage (the induced electromotive force) can be generated in the closed circuit L1 simply by supplying a current to the lead terminal 80. Therefore, there is no need to apply any voltage to the lead terminal 30 for a purpose of detecting disconnection, and there is no need to prepare a tester for detecting disconnection (a voltage applying module); as a result, the aforementioned tester can be used for other tests. That is, efficient use of the tester is realized. Besides, in the method for detecting wire disconnection in the above semiconductor device 110, at a stage of the operation confirmation step, the output signal based on which the presence of a disconnection can be determined is output from the output terminal Vout of the comparator 18*a*. Therefore, it is possible to perform two types of tests at once, allowing to shorten a test time for the semiconductor device 110. Further, since whether disconnection is present or not is output from the output terminal Vout of the comparator 18*a*, there is no need to provide an electrode pad for measuring current (so called a test use only pad), resulting in improving a degree of freedom of a layout of a semiconductor chip.

Modification Example 1

Figure 2:
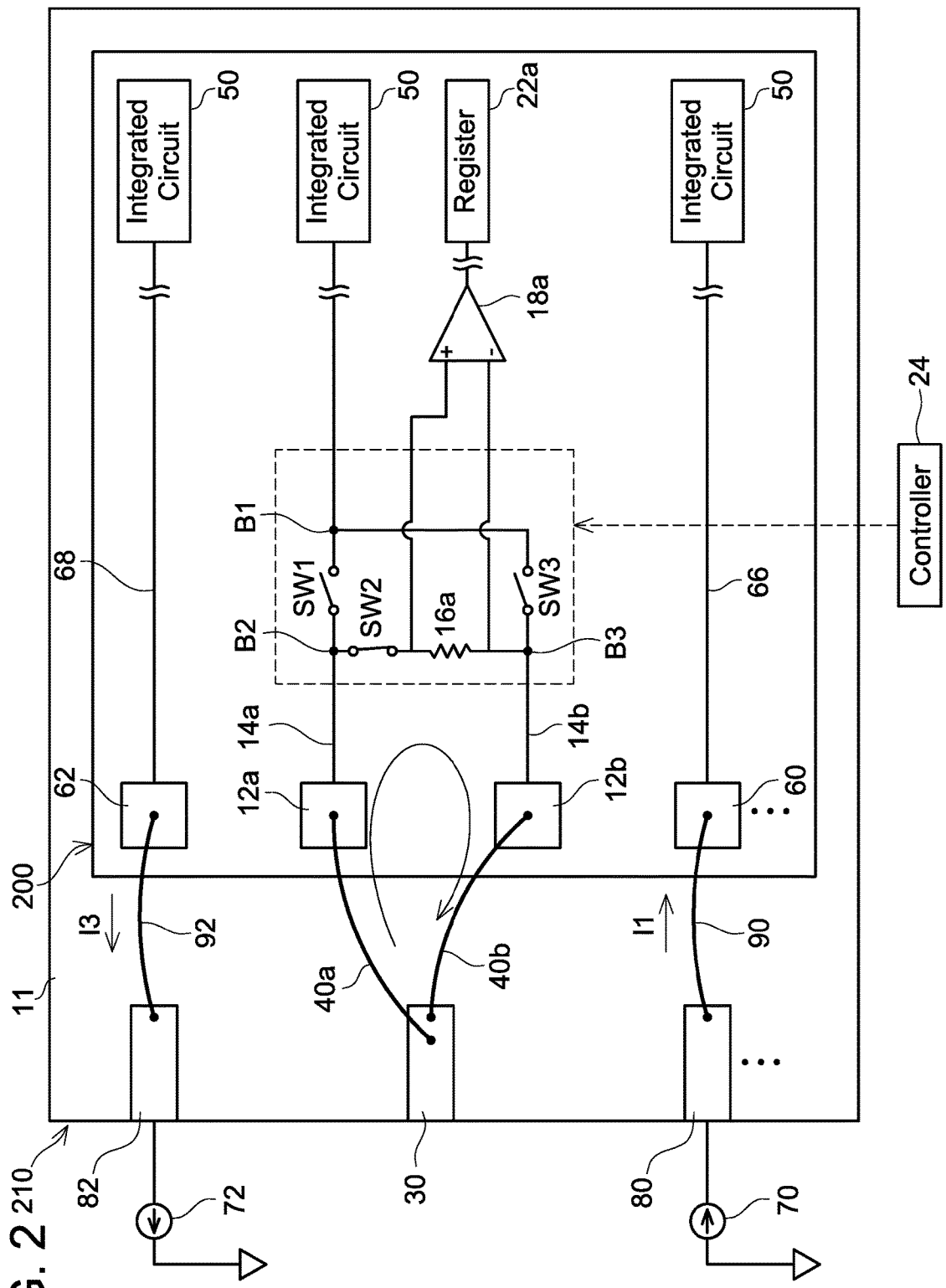

Next, a semiconductor chip 200 of a modification example 1 will be explained with reference to FIG. 2. In the following, differences from the embodiment 1 will be explained mainly, and same reference numerals will be used for configurations that are identical to those of the embodiment 1 with detailed descriptions omitted. A same rule is applied to an embodiment 2. The semiconductor chip 200 is packaged, with a plurality of lead terminals by the resin 11, and thereby composes a semiconductor device 210. The semiconductor device 210 of the modification example 1 differs from the semiconductor device 110 of the embodiment 1 in that the semiconductor chip 200 comprises an electrode pad 62 and a wire 68, and the semiconductor device 210 comprises a lead terminal 82. The electrode pad 62 is provided, adjacent to the electrode pad 12*a*, on an opposite side of the electrode pad 12*b* with respect to the electrode pad 12*a* (that is, an upper side in FIG. 2). Similarly, the lead terminal 82 is provided, adjacent to the lead terminal 30, on an opposite side of the lead terminal 80 with respect to the lead terminal 30 (that is, the upper side in FIG. 2). The electrode pad 62 is wire-bonded to one end of the lead terminal 82 with a wire 92. The wire 68 connects the electrode pad 62 with the integrated circuit 50. A current source 72 is connectable to another end of the lead terminal 82. The current source 72 is a current source to test quality of the semiconductor device 210 in an operation confirmation step. The current source 72 supplies the wire 92 with a current I3 flowing leftward in FIG. 2 at a same time as the current source 70 supplying the current I1. The current source 72 supplies the current I3 increasing at a constant rate during a predetermined time in the operation confirmation step. Note that the current I3 corresponds to one example of "current generating an induced electromotive force".

When the current I3 flows through the wire 92 leftward by the current source 72, magnetic field generated around the wire 92 penetrates the closed circuit L1 in a direction from a lower surface to an upper surface of the semiconductor chip 200. Accordingly, in a case where neither of the wires 40*a*, 40*b* are disconnected, an induced electromotive force Ve2 is generated in the closed circuit L1 by electromagnetic induction. The direction in which magnetic field generated around the wire 92 penetrates the closed circuit L1 is same as the direction in which the magnetic field generated around the wire 90 by the current I1 penetrates the closed circuit L1. Therefore, voltage of Ve1+Ve2 is applied across the both ends of the resistor 16*a* and thus an input voltage Vin1, with a value of Ve1+Ve2 being input to the non-inverting input terminal Vin+ of the comparator 18*a*.

This configuration also realizes similar effects to those of the embodiment 1. Besides, by supplying current to two wires 90, 92 positioned on both sides of the closed circuit L1 as explained above, it becomes possible to increase magnetic flux density penetrating the closed circuit L1 as well as the induced electromotive force generated in the closed circuit L1. Therefore, even in a situation where a sufficient induced electromotive force cannot be generated due to a limitation on a current amount that can flow in each wire and the like, a sufficiently large induced electromotive force can be generated in the closed circuit L1, and a precise output signal can be obtained from the output terminal Vout of the comparator 18*a*. Note that a number of wires for supplying current is not limited to two, but may be more than or equal to three.

Embodiment 2

Figure 3:
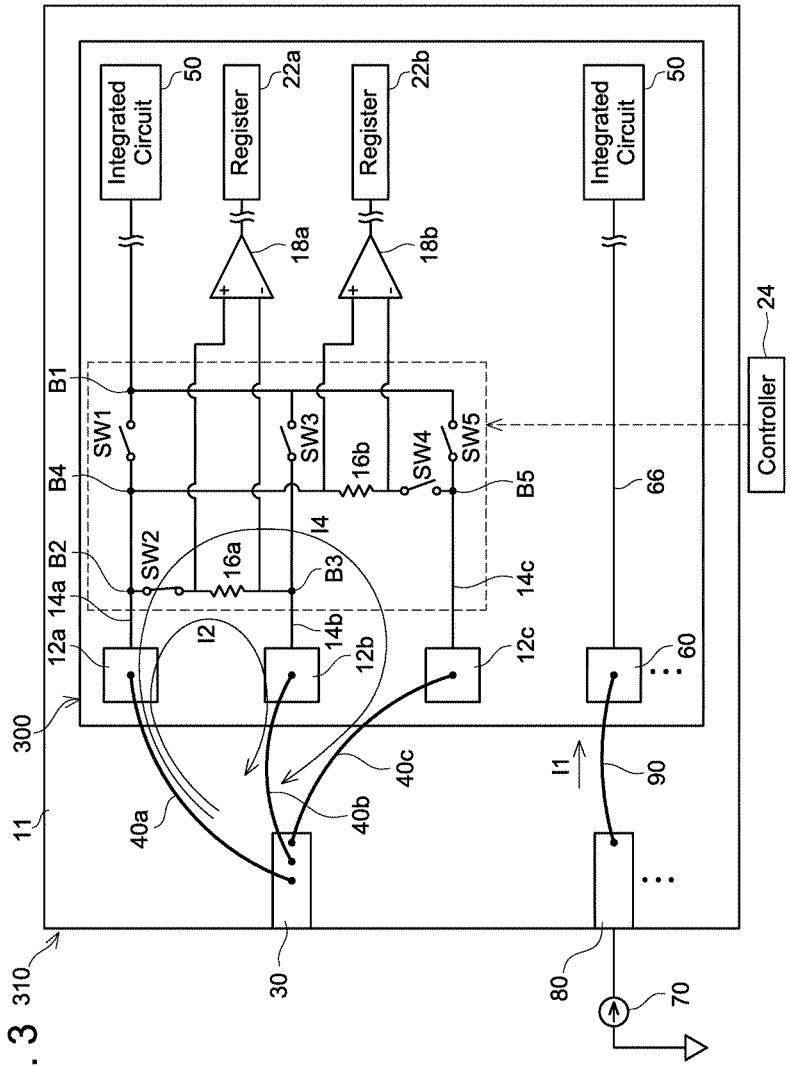

Next, a semiconductor chip 300 of an embodiment 2 will be explained with respect to FIG. 3. The semiconductor chip 300 is packaged by resin 11 with a plurality of lead terminals, and thereby composes a semiconductor device 310. The semiconductor chip 300 of the embodiment 2 differs from the semiconductor chip 100 of the embodiment 1 in that the semiconductor chip 300 comprises an electrode pad 12*c*, a wire 14*c*, a resistor 16*b*, a comparator 18*b*, and switches SW4, SW5 in addition to each component which the semiconductor chip 100 comprises.

The electrode pad 12*c* is provided between the electrode pad 12*b* and the electrode pad 60. The electrode pad 12*c* is wire-bonded to one end of the lead terminal 30 with a wire 40*c*. That is, the electrode pads 12*a*, 12*b*, 12*c* are triple-bonded to the common lead terminal 30. The wire 14*c* connects the electrode pad 12*c* with the integrated circuit 50. Accordingly, when a power supply voltage is applied to the lead terminal 30, a current even larger than the current in the double-bonding configuration can be supplied to the integrated circuit 50 via wires 14*a*, 14*b*, 14*c*. The wire 14*c* joins the wire 14*a* at the point B1 to form one wire. Note that the electrode pad 12*c* corresponds to one example of "forth electrode pad".

The resistor 16*b* is a resistor with resistance R2, and is connected between a point B4 of the wire 14*a* and a point B5 of the wire 14*c*. The comparator 18*b* is a comparator with a threshold value, and is configured to compare a voltage on a higher potential side and a voltage on a lower potential side of the resistor 16b and to output a comparison result as a binary signal. One end of the resistor 16b is connected to a non-inverting input terminal Vin+ of the comparator 18b, and another end is connected to an inverting input terminal Vin−. An output terminal Vout of the comparator 18b is connected to a register 22b inside of the semiconductor chip 300. A voltage Vin2 across both ends of the resistor 16b (hereinafter also called as "input voltage Vin2") is input to the non-inverting input terminal Vin+. In a case where the input voltage Vin2 exceeds the threshold value, the output terminal Vout outputs an H signal, while in a case where the input voltage Vin2 falls below the threshold value, the output terminal Vout outputs an L signal. An output signal is stored in the register 22b. Note that the resistor 16b corresponds to one example of "second resistor", and the comparator 18b corresponds to one example of "second comparator".

The switch SW4 is provided, adjacent to the resistor 16b, between the point B4 and the point B5. While the switch SW4 is on, a closed circuit L2 is formed in which the lead terminal 30, the electrode pad 12a, the resistor 16b, the switch SW4, and the electrode pad 12c with wires 40a, 40c and wires 14a, 14c are connected. The switch SW5 is provided between the point Bland the point B5 of the wire 14c. Besides, in the present embodiment, the point B4 is positioned on the integrated circuit 50 side from the point B2 in the wire 14a. In this case, the switch SW1 is connected between the point B1 and the point B4. The controller 24 controls on and off of the switches SW4, SW5 in addition to the switches SW1 to SW3. Specifically, the controller 24 controls the switches SW1 to SW5 to switch to either of the following three cases of circuits. That is, in a case 1, the switch SW2 is on and the switches SW1, SW3, SW4, SW5 are off. In a case 2, the switch SW4 is on and the switches SW1, SW2, SW3, SW5 are off. In a case 3, the switches SW1, SW3, SW5 are on and the switches SW2, SW4 are off. Accordingly, in the case 1, the closed circuit L1 is formed while the closed circuit L2 is not formed, and the electrode pads 12a to 12c are electrically disconnected from the integrated circuit 50. In the case 2, the closed circuit L2 is formed while the closed circuit L1 is not formed, and the electrode pads 12a to 12c are electrically disconnected from the integrated circuit 50. In the case 3, the closed circuits L1, L2 are not formed while the electrode pads 12a to 12c are connected to the integrated circuit 50. Note that the closed circuit L2 corresponds to one example of "second closed circuit".

A method for detecting disconnection of at least one of the wires 40a, 40b, 40c will be explained A case where the controller 24 switches to the circuit of the above case 1 in the operation confirmation step is same as the case where the controller 24 turns on the switch SW2 in the embodiment 1. The disconnection of at least one of the wires 40a, 40b can be detected by using the circuit of the case 1. On the other hand, when the controller 24 switches to the circuit of the above case 2, the current source 70 supplies the lead terminal 80 with the current I1 increasing at a constant rate.

In a case where neither of the wires 40a, 40c are disconnected, an induced electromotive force Ve3 with a constant value is generated in the closed circuit L2 by electromagnetic induction. With this configuration, an induced current 14 (=Ve3/R2) flows through the closed circuit L2 in the clockwise direction. Since an area of the closed circuit L2 is larger than that of the closed circuit L1, the induced electromotive force Ve3 is larger than the induced electromotive force Ve1. Since a voltage that is equal to the induced electromagnetic force Ve3 is applied across the both ends of the resistor 16b, the input voltage Vin2 is equal to the induced electromagnetic force Ve3. The threshold value of the comparator 18b is preset so as to be larger than 0 and smaller than Ve3. Accordingly, the input voltage Vin2 (=Ve3) exceeds the threshold value, resulting in the output terminal Vout of the comparator 18b outputting the H signal. The output signal is stored in the register 22b. On the other hand, in a case where at least one of the wires 40a, 40c is disconnected, no induced electromotive force is generated in the closed circuit L2. Therefore, no electric potential difference is generated across the both ends of the resistor 16b, and thus the input voltage Vin2 becomes 0 [V]. Accordingly, Vin2 (=0) falls below the threshold value, which causes the output terminal Vout to output the L signal. The output signal is stored in the register 22b.

The presence of the disconnection can be detected by reading the output signal stored in the register 22b. When a read value is the H signal, it is determined that the wires 40a, 40c are not being disconnected, and when the read value is the L signal, it is determined that at least one of the wires 40a, 40c is disconnected.

The semiconductor device 310 detected to have no disconnection in the disconnection detection test is subjected to further tests, and when the semiconductor device 310 is determined to be a non-defective product as a result, it is mounted on the substrate. In using the semiconductor device 310 in a normal operation after it has been mounted on the substrate, first, the controller 24 switches to the circuit of the above case 3. Next, the power supply voltage is applied to the lead terminal 30 to apply a voltage to the electrode pads 12a to 12c. Accordingly, the current is supplied to the integrated circuit 50 via the wires 14a to 14c from the lead terminal 30.

The configuration explained above also realizes similar effects to that of the embodiment 1. Besides, since the controller 24 does not turn on the switch SW2 and the switch SW4 at a same time, a situation where the closed circuit L1 and the closed circuit L2 are formed at a same time never occurs. Accordingly, mutual interference caused by the induced currents 12, 14 flowing through both of the closed circuits L1, L2, respectively by electromagnetic induction (for example, a phenomenon in which an induced electromotive force is newly generated by a magnetic field generated around the induced current 12 flowing through the wire 40b penetrates the closed circuit L2) can be avoided. Thus, a disconnection among the wires 40a to 40c can be properly detected. In addition, the controller 24 switches the switches SW1 to SW5 in different ways for the cases of detecting disconnection among the wires 40a to 40c (the cases 1, 2) and for the case of using the semiconductor device 310 in the normal operation (the case 3). Accordingly, when the disconnection among the wires 40a to 40c is detected, the induced current flowing through the closed circuit L1 or the closed circuit L2 can be suppressed from flowing toward the integrated circuit 50 side. On the other hand, when the semiconductor device 310 is used in the normal operation, the current flowing through the integrated circuit 50 via the wires 14a to 14c from the lead terminal 30 can be suppressed from flowing into the resistors 16a, 16b sides and the comparator 18a, 18b sides. Therefore, a precise output signal is output from the output terminal Vout of each of the comparators 18a, 18b. Accordingly, reliability of detecting the disconnection among the wires 40a to 40c is improved.

The embodiments disclosed by the present description were explained in detail above, but these embodiments are mere examples, and the semiconductor chip and the method for detecting disconnection of a wire bonded to the same disclosed by the present description include various modifications of the above mentioned embodiments.

For example, in the above embodiments and the modification example, the magnetic field is generated by supplying the current to the lead terminal adjacent to the closed circuit. However, a configuration for generating the magnetic field is not limited thereto. For instance, a wire may be disposed in a vicinity of a semiconductor device, and magnetic flux may be applied to a closed circuit by supplying a current to the wire. Alternatively, magnetic flux may be applied to a closed circuit by disposing a magnet in a vicinity of a semiconductor device. Note that in the above embodiments and the modification example, the lead terminals for supplying current need not to be adjacent to the closed circuit as long as the magnetic field is configured to penetrate the closed circuit.

Moreover, in the above embodiments and the modification example, disconnection of at least one of the wires is detected by making use of the resistor and the comparator. However, a configuration is not limited thereto. For example, disconnection among the wires may be detected by making use of an ammeter. Moreover, a number of wires bonded to a common lead terminal may be more than or equal to four. That is, a technique the present description discloses can be used for detecting disconnection among multi-bonded wires. Moreover, the test for detecting disconnection may be performed after the semiconductor device has been mounted on the substrate. Moreover, a semiconductor chip may be packaged with ceramic instead of resin.

Further, in the semiconductor chip 300 of the embodiment 2, a resistor may be connected between the wire 14b and the wire 14c, and a comparator with a threshold value (hereinafter called as a comparator 18c) which is configured to compare voltages of both ends of the resistor may be connected to the both ends of the resistor. A switch (hereinafter called as a switch SW6) may be connected adjacent to the resistor. A closed circuit (hereinafter called as a closed circuit L3) may be formed, the closed circuit L3 being formed by the lead terminal 30, the electrode pad 12b, the switch SW6, the resistor and the electrode pad 12c being connected with the wires 40b, 40c and the wires 14b, 14c. The controller 24 may control the switches SW1 to SW6 not to form two of the three closed circuits L1 to L3 when one of the closed circuits L1 to L3 is formed, and to electrically disconnect the electrode pads 12a to 12c from the integrated circuit 50. According to this configuration, it is possible to identify which wire of the wires 40a to 40c is disconnected. For example, assume a case where the L signal is output from the comparator 18a when the closed circuit L1 is formed, the L signal is output from the comparator 18b when the closed circuit L2 is formed, and the H signal is output from the comparator 18c when the closed circuit L3 is formed. In this case, with the output signals from the comparators 18a, 18b alone, it is impossible to identify which of the wires 40a to 40c is disconnected although disconnection of one or more of the wires 40a to 40c can be detected. However, since the output signal from the comparator 18c is H, it becomes possible to identify that only the wire 40a is disconnected. Conventionally, disconnection was visually inspected by stripping off the resin packaging the semiconductor chip in order to identify a wire with disconnection among the triple bonded wires. However, according to the above configuration, it is possible to identify a wire with disconnection without stripping off the resin.

Further configurations of semiconductor chips that the present description discloses are listed in the following.

The semiconductor chip may further comprise a group of switches configured to switch between at least following states (1) and (2):

the state (1) where the first electrode pad and the second electrode pad are electrically disconnected from a circuit in the semiconductor chip so as to configure the first closed circuit; and the state (2) where the first electrode pad and the second electrode pad are connected to the circuit in the semiconductor chip and not configuring the first closed circuit.

According to this configuration, the group of switches electrically disconnect the first electrode pad and the second electrode pad from the circuit in the semiconductor chip when the first closed circuit is configured. Therefore, the induced current flowing through the first closed circuit by electromagnetic induction can be suppressed from flowing toward a circuit side. Moreover, the group of switches connects the first electrode pad and the second electrode pad to the circuit in the semiconductor chip when the closed circuit is not configured. Therefore, the current flowing through each of the first electrode pad and the second electrode pad by the application of the power supply voltage to the first lead terminal is properly supplied to the circuit side, and the current is suppressed from flowing into a first current detector side. Hence, the disconnection among the wires is properly detected.

In one aspect of the semiconductor chip the present description discloses, the first current detector comprises a first resistor and a first comparator. The first resistor is connected between the first electrode pad and the second electrode pad. The first comparator is configured to compare a voltage on a higher potential side and a voltage on a lower potential side of the first resistor. According to this configuration, by setting a threshold value of the first comparator to be larger than 0 and smaller than a voltage that is applied across the first resistor of when an induced electromotive force is generated in the first closed circuit, the first comparator is configured to exhibit different outputs depending on whether an induced current flows through the first closed circuit (that is, a case where none of the wires is disconnected) or the induced current does not flow through the first closed circuit (that is, a case where at least one of the wires is disconnected). Therefore, the disconnection of at least one of the wires can be easily detected by checking the output from the first comparator.

In another aspect of the semiconductor chip the present description discloses, the semiconductor chip further comprises a fourth electrode pad and a second current detector. The fourth electrode pad is to be wire-bonded to the first lead terminal to which the first electrode pad and the second electrode pad are wire-bonded. The second current detector is connected between the first electrode pad and the fourth electrode pad. A second closed circuit is configured by the first lead terminal, the first electrode pad, the second current detector, and the fourth electrode pad. An induced current flows through the second closed circuit when a current generating an induced electromotive force is applied to the third electrode pad. The second current detector is configured to output different values depending on whether the induced current exceeds a threshold value or not. In the above semiconductor chip, the second closed circuit is formed by the first lead terminal, the first electrode pad, the second current detector and the fourth electrode pad when the fourth electrode pad is wire-bonded to the first lead terminal. Therefore, by changing magnetic flux that penetrates the second closed circuit by the application of the current generating the induced electromotive force to the third electrode pad, the disconnection of at least one of the wires composing the second closed circuit (that is, wires bonding each of the first and the fourth electrode pads to the first lead terminal) can be detected. That is, disconnection in not only the wires composing the first closed circuit but also in the wires composing the second closed circuit can be detected.

In another aspect of the semiconductor chip the present description discloses, the semiconductor chip further comprises a group of switches configured to switch among at least following states (1), (2), and (3):

the state (1) where the first electrode pad, the second electrode pad, and the fourth electrode pad are electrically disconnected from a circuit in the semiconductor chip so as to configure the first closed circuit but not to configure the second closed circuit;

the state (2) where the first electrode pad, the second electrode pad, and the fourth electrode pad are electrically disconnected from the circuit in the semiconductor chip so as to configure the second closed circuit but not to configure the first closed circuit; and the state (3) where the first electrode pad, the second electrode pad, and the fourth electrode pad are connected to the circuit in the semiconductor chip and configuring neither the first closed circuit nor the second closed circuit.

According to this configuration, the second closed circuit is not formed when the first closed circuit is formed, whereas the first closed circuit is not formed when the second closed circuit is formed. Therefore, the electromagnetic induction does not occur in the first closed circuit and the second closed circuit at the same time. Accordingly, a situation where two induced currents with opposite directions of each other flow into a wire which composes both of the first and the second closed circuits can be avoided from occurring. Besides, the mutual interference caused by the induced current flows through both of the first and the second closed circuits can be prevented. Specifically, a following situation can be avoided from occurring. That is, when magnetic field generated by an induced current flowing through one of the two closed circuits penetrates another of the two closed circuits, new induced current flows through another closed circuit by a new electromagnetic induction, causing interference with an induced current which have been already flowing through another closed circuit. With the above configuration, such a situation can be avoided from occurring. Therefore, disconnection of at least one of the wires of each of the first and the second closed circuits can be properly detected. Moreover, according to the configuration, the group of switches electrically disconnects the first, the second and the fourth electrode pads from the circuit in the semiconductor chip when either of the first or the second closed circuit is formed. Therefore, the induced current flowing through either of the first or the second closed circuit can be suppressed from flowing toward the circuit side. Further, the group of the switches connects the first, the second and the fourth electrode pads to the circuit in the semiconductor chip when both of the first or the second closed circuits are not formed. Therefore, when the power supply voltage is applied to the first lead terminal, current flowing through each of the first, the second, and the fourth electrode pads is properly supplied to the circuit side, enabling to suppress the current from flowing into the first and the second current detectors side.

In another aspect of the semiconductor chip the present description discloses, the first current detector comprises a first resistor and a first comparator. The first resistor is connected between the first electrode pad and the second electrode pad. The first comparator is configured to compare a voltage on a higher potential side and a voltage on a lower potential side of the first resistor. Further, the second current detector comprises a second resistor and a second comparator. The second resistor is connected between the first electrode pad and the fourth electrode pad. The second comparator is configured to compare a voltage on a higher potential side and a voltage on a lower potential side of the second resistor. According to this configuration, by setting a threshold value of the first comparator to be larger than 0 and smaller than a voltage that is applied across the first resistor of when an induced electromotive force is generated in the first closed circuit, the first comparator exhibits different outputs depending on whether the induced current flows through the first closed circuit or not. Likewise, by setting a threshold value of the second comparator to be larger than 0 and smaller than a voltage that is applied across the second resistor of when an induced electromotive force is generated in the second closed circuit, the second comparator exhibits different outputs depending on whether the induced current flows through the second closed circuit or not. Therefore, disconnection among the wires can be easily detected by checking an output from each of the first and the second comparators.

Specific examples of the present invention have been described in detail, however, these are mere exemplary indications and thus do not limit the scope of the claims The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor chip comprising:
a first electrode pad wire-bonded to a first lead terminal;
a second electrode pad wire-bonded to the first lead terminal;
a first current detector connected between the first electrode pad and the second electrode pad; and
a third electrode pad wire-bonded to a second lead terminal different from the first lead terminal,
wherein
a first closed circuit is configured by the first lead terminal, the first electrode pad, the first current detector, and the second electrode pad,
the first closed circuit is configured such that an induced current flows through the first closed circuit when a current generating an induced electromotive force is applied to the third electrode pad, and
the first current detector is configured to output different values depending on whether the induced current exceeds a threshold value or not.

2. The semiconductor chip according to claim 1, further comprising a group of switches configured to switch at least between the following states (1) and (2), wherein:
state (1) is a state where the first electrode pad and the second electrode pad are electrically disconnected from a circuit in the semiconductor chip so as to configure the first closed circuit; and the state (2) is a state where the first electrode pad and the second electrode pad are connected to the circuit in the semiconductor chip and not configuring the first closed circuit.

3. The semiconductor chip according to claim 2, wherein the first current detector comprises:
   a first resistor connected between the first electrode pad and the second electrode pad; and
   a first comparator configured to compare a voltage on a higher potential side and a voltage on a lower potential side of the first resistor.

4. The semiconductor chip according to claim 1, further comprising:
   a fourth electrode pad wire-bonded to the first lead terminal; and
   a second current detector connected between the first electrode pad and the fourth electrode pad,
   wherein
   a second closed circuit is configured by the first lead terminal, the first electrode pad, the second current detector, and the fourth electrode pad,
   the second closed circuit is configured such that an induced current flows through the second closed circuit when a current generating an induced electromotive force is applied to the third electrode pad, and
   second current detector is configured to output different values depending on whether the induced current exceeds a threshold value or not.

5. The semiconductor chip according to claim 4, further comprising a group of switches configured to switch among at least the following states (1), (2), and (3), wherein:
   state (1) is a state where the first electrode pad, the second electrode pad, and the fourth electrode pad are electrically disconnected from a circuit in the semiconductor chip so as to configure the first closed circuit but not to configure the second closed circuit;
   state (2) is a state where the first electrode pad, the second electrode pad, and the fourth electrode pad are electrically disconnected from the circuit in the semiconductor chip so as to configure the second closed circuit but not to configure the first closed circuit; and
   state (3) is a state where the first electrode pad, the second electrode pad, and the fourth electrode pad are connected to the circuit in the semiconductor chip and configuring neither the first closed circuit nor the second closed circuit.

6. The semiconductor chip according to claim 5, wherein the first current detector comprises:
   a first resistor connected between the first electrode pad and the second electrode pad; and
   a first comparator configured to compare a voltage on a higher potential side and a voltage on a lower potential side of the first resistor, and
   the second current detector comprises:
   a second resistor connected between the first electrode pad and the fourth electrode pad; and
   a second comparator configured to compare a voltage on a higher potential side and a voltage on a lower potential side of the second resistor.

7. A method for detecting disconnection of at least one wire arranged on a semiconductor chip comprising;
   a first electrode pad to be wire-bonded to a first lead terminal;
   a second electrode pad to be wire-bonded to the first lead terminal;
   a first current detector connected between the first electrode pad and the second electrode pad; and
   a third electrode pad to be wire-bonded to a second lead terminal different from the first lead terminal
   the at least one wire comprises a wire with which a first electrode pad and a first lead terminal are wire-bonded and another wire with which a second electrode pad and a first lead terminal are wire-bonded, the method comprising:
   applying a current generating an induced electromotive force to a third electrode pad from a second lead terminal; and
   detecting an output from a first current detector at the time when the current generating the induced electromotive force is applied.

8. A method for detecting disconnection of at least one of a first wire and a second wire of a semiconductor chip, the method comprising:
   providing a semiconductor chip comprising:
      a first electrode pad to be wire-bonded to a lead terminal with the first wire;
      a second electrode pad to be wire-bonded to the lead terminal with the second wire; and
      a current detector connected between the first electrode pad and the second electrode pad,
      wherein a closed circuit is configured by the lead terminal, the first wire, the first electrode pad, the current detector, the second electrode pad, and the second wire,
   applying magnetic flux in a direction penetrating the closed circuit; and
   detecting disconnection of at least one of the first wire and the second wire depending on an output value from the current detector in the applying of magnetic flux.

* * * * *